United States Patent [19]

Mantovani et al.

[11] Patent Number: 5,802,168
[45] Date of Patent: Sep. 1, 1998

[54] ISDN CAPACITY EXPANSION FOR REMOTE TERMINAL SITES

[75] Inventors: John C. Mantovani, Suwannee; David B. Milliron, Woodstock; Joseph F. Zimmerman, Newnan, all of Ga.

[73] Assignee: Conklin Instrument Corp., Pleasant Valley, N.Y.

[21] Appl. No.: 592,578

[22] Filed: Jan. 26, 1996

[51] Int. Cl.⁶ ..................................... H04M 7/00
[52] U.S. Cl. .................. 379/329; 379/331; 370/463
[58] Field of Search .................. 379/328, 329, 379/330, 331, 332, 397, 399, 412; 370/359, 419, 463

[56] References Cited

U.S. PATENT DOCUMENTS 4,736,406  4/1988  Molnar ........................ 379/94

OTHER PUBLICATIONS

Fitel–PMX Brochure (4 sheets), undated.

*Primary Examiner*—Daniel S. Hunter
*Attorney, Agent, or Firm*—Fish & Richardson P.C.

[57] ABSTRACT

A method and apparatus for increasing the capacity of a remote terminal cabinet and providing ISDN Basic Rate Interfaces to the remote cabinet which otherwise has insufficient additional physical slots to support such ISDN Basic Rate Interfaces is described. The method features removing any protective covering from a space previously designated for but lacking a protection block equipment and installing in the space ISDN Basic Rate Interface equipment. The installation includes securing the equipment physically in place and connecting the equipment for communications with a T1 carrier service at a first interface and a plurality of ISDN BRI interfaces to customer premises lines at a second interface. The remainder of the remote cabinet communications is left unaffected.

7 Claims, 12 Drawing Sheets

ISDN CAPACITY EXPANSION FOR REMOTE TERMINAL SITES

BACKGROUND OF THE INVENTION

The invention relates generally to providing ISDN BRI service to customers, and in particular, to a method and apparatus for providing ISDN BRI service to customers who are not easily reachable from an ISDN equipped central office or remote terminal.

As ISDN basic rate interface service expands substantially, it often occurs that T1, on either fiber optics or copper, extends to a remote terminal cabinet, but that the cabinet itself is operating at full capacity and does not have the additional shelf space to provide further ISDN BRI loops or service to new or existing customers, or that the cabinets do not have three empty adjacent slots which would make it relatively easy to add additional ISDN service. As a result, either additional remote terminal cabinets must be built and integrated into the system, or the shelf must be rearranged, (moving existing subscribers to other time/physical slots thus requiring substantial labor and coordination with the central office) or the new ISDN service is not available.

The problem of providing ISDN service to remote customers is exacerbated by the continuing and increasing demand for the service itself. Thus, various new technologies either require ISDN or equivalent service, such as, for example, video conferencing, wideband data services, lottery services, etc. The telephone companies, however, while having substantial remote terminal cabinets available to them, spaced from the central office, find that those remote terminals are already full and have no additional shelf space to provide further ISDN or POTS service or requiring grooming of the cabinet. (A typical ISDN line requires three time slots on a T1 line and often requires three physical slots in the cabinet.) As a result, the telephone companies are faced with substantial capital expenses relating to the addition of further remote terminal cabinets or substantial labor costs. It is thus not a simple matter to add a remote terminal, since those cabinets are not only large and expensive, but also must be appropriately mounted and fixed for permanent use.

Accordingly, the invention provides a method and apparatus for advantageously increasing the capacity of remote terminal cabinets even though, at first blush, the cabinets appear to already be full or otherwise not able to provide the card slots needed to provide such service. Other objects of the invention are an economical and practical method and apparatus for increasing the ISDN capability of a remote cabinet without sacrificing or reducing any other service being provided by the remote cabinet.

SUMMARY OF THE INVENTION

The invention thus relates to a method for increasing the capacity of a remote terminal cabinet for providing ISDN Basic Rate Interfaces where a remote cabinet has insufficient additional physical slots on its shelves to practically support such ISDN Basic Rate Interface service. The method features identifying space previously designated for, but lacking protection block equipment; installing in said space ISDN Basic Rate Interface equipment, including securing the equipment physically in place and connecting the equipment for communications with T1 carrier service on a first communications interface and a plurality of ISDN BRI interfaces to customers at a second communications interface; and leaving the remainder of the remote cabinet communications unaffected. In particular embodiments of the invention, the method features pivotally mounting the ISDN BRI equipment for pivotal movement to and from a secured position in said space and securing the equipment in this space when the equipment is pivoted into the space from a mounting position outside of the space. In this manner, at least eight ISDN BRI interfaces can be provided from a T1 line originating at, for example, the central office.

The apparatus of the invention relates to providing at least eight ISDN Basic Rate Interfaces in a remote cabinet previously considered as fully filled or expected to be full. The apparatus features an interconnection equipment having an interface to at least one T1 line, at least eight ISDN Basic Rate Interfaces for connection to telephone subscribers, and circuitry for interconnecting to the T1 line and providing the ISDN communications protocols at the ISDN interfaces. The apparatus further features a pivot mount for connecting the equipment for pivoting movement from a service position in which the equipment is available for servicing or installation in the remote cabinet to an operating position in which the equipment fits within a previously blank volume within a full capacity remote terminal. The apparatus further has a mounting chassis for mounting the equipment, the chassis having at least two corners thereof foreshortened to allow the chassis, with the equipment, to pivot into the operating position. In a particular embodiment of the invention, the protection block space is designed for a 307 protection block assembly. That space, one or more of which spaces is typically left empty in a remote cabinet, is useful in accordance with the invention for providing the additional ISDN capacity to the remote cabinet without adversely interfering with any of the already used and typically fully occupied shelf space within the remote cabinet.

BRIEF DESCRIPTION OF THE DRAWING

Other objects, features and advantages of the invention will be apparent from the following description taken together with the drawings in which.

DESCRIPTION OF THE PREFERRED EMBODIMENT

Figure 1:
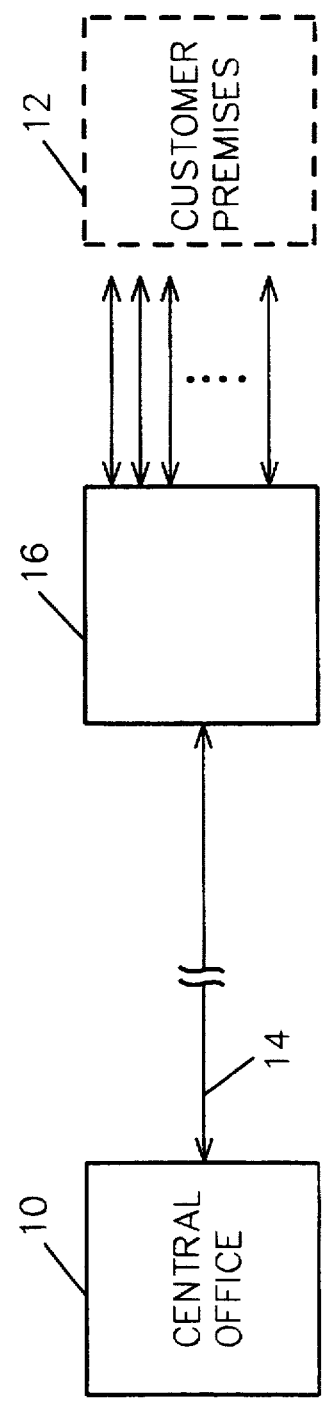
FIG. 1 is a block diagram illustrating the typical environment in which the invention operates.

Referring to FIG. 1, in a typical telephone service distribution system, a central office 10 provides various levels of service to a plurality of customer premises 12. In a particular service of interest, in accordance with the invention, the central office provides T1 service typically over either a fiber optics or copper communications path 14 to each of a plurality of remote terminal cabinets 16. These terminal cabinets convert the electrical signal data provided over lines 14 into, for example, ISDN Basic Rate Interface service and/or POTS service as is well known in the art.

The remote terminal or cabinet 16 currently exists, in large numbers, in many metropolitan areas. These units typically have limited shelf space for a maximum number of boards or cards, after which, the cabinets are filled to capacity. In practice, the growth of the telephone service industry has dictated that many older remote terminals or cabinets are filled to capacity and have no additional shelf space available to provide the additional service that is being demanded, and other remote terminals, even if not filled to capacity, are expected to be filled to capacity shortly, or do not have the typically three empty adjacent slots needed to provide ISDN service. In particular, ISDN BRI service can therefore not easily reach or be provided to all customers who desire it even though it has become a popular and needed form of service which is in growing demand.

Figure 2:
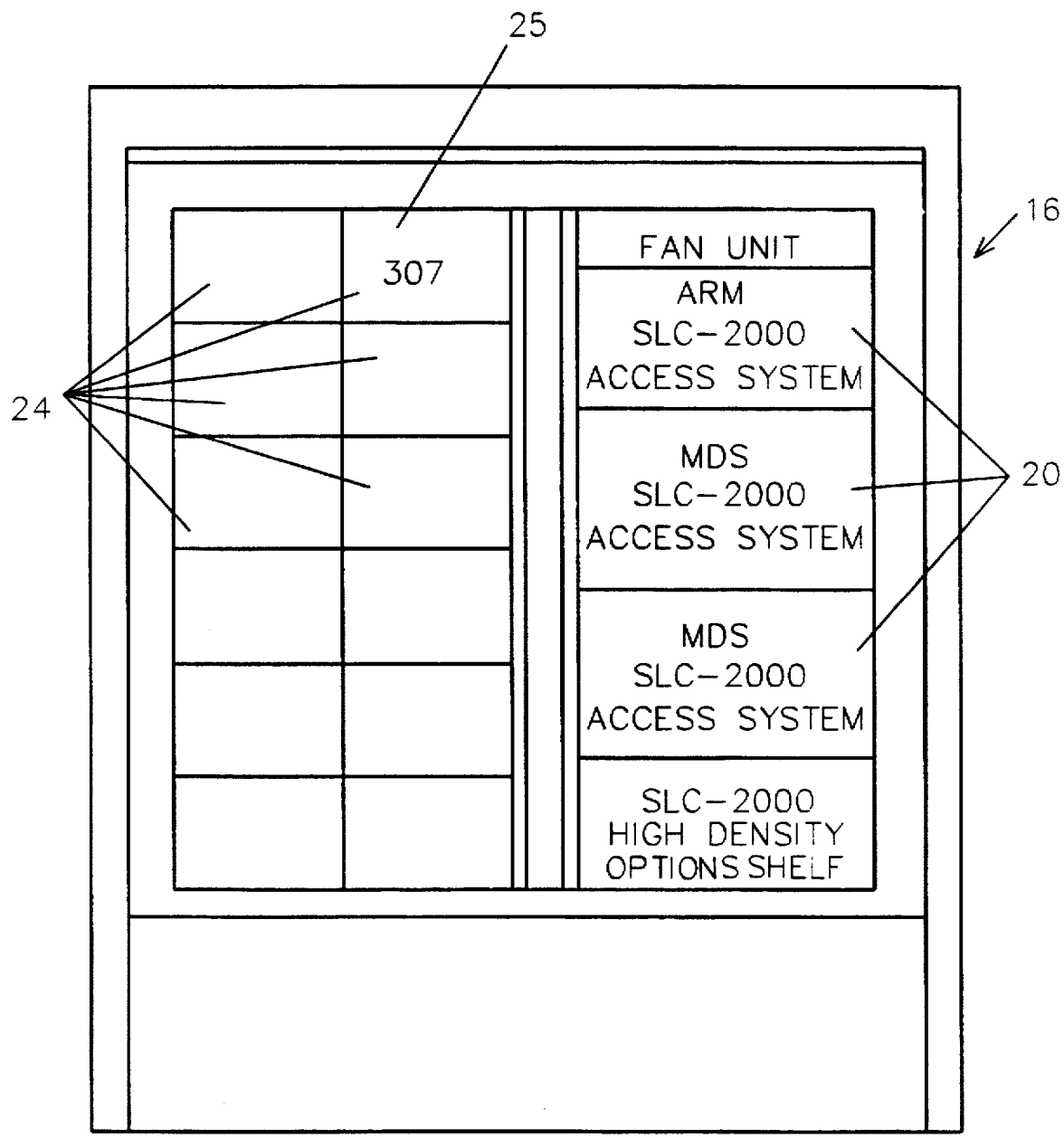
FIG. 2 is a front view of a typical remote cabinet used with the invention.

Referring to FIG. 2, a typical remote terminal cabinet 16 has a plurality of shelves 20 which mount, for example, in a twenty-three inch frame. Each shelf, in the typical, in place, operating remote terminal cabinet is full or expected to soon be full, and has a plurality of cards providing various customer premises services, power supply, and alarm condition activities. Each remote unit also has a plurality of spaces, designated 24 in FIG. 2, which are used for, typically, the 307 protection block 25. The typical remote cabinet however, has substantially more of these spaces than are actually used so that many of these spaces contain blank panels covering the volumes therein. It is this space to which the invention is directed.

Figure 3:
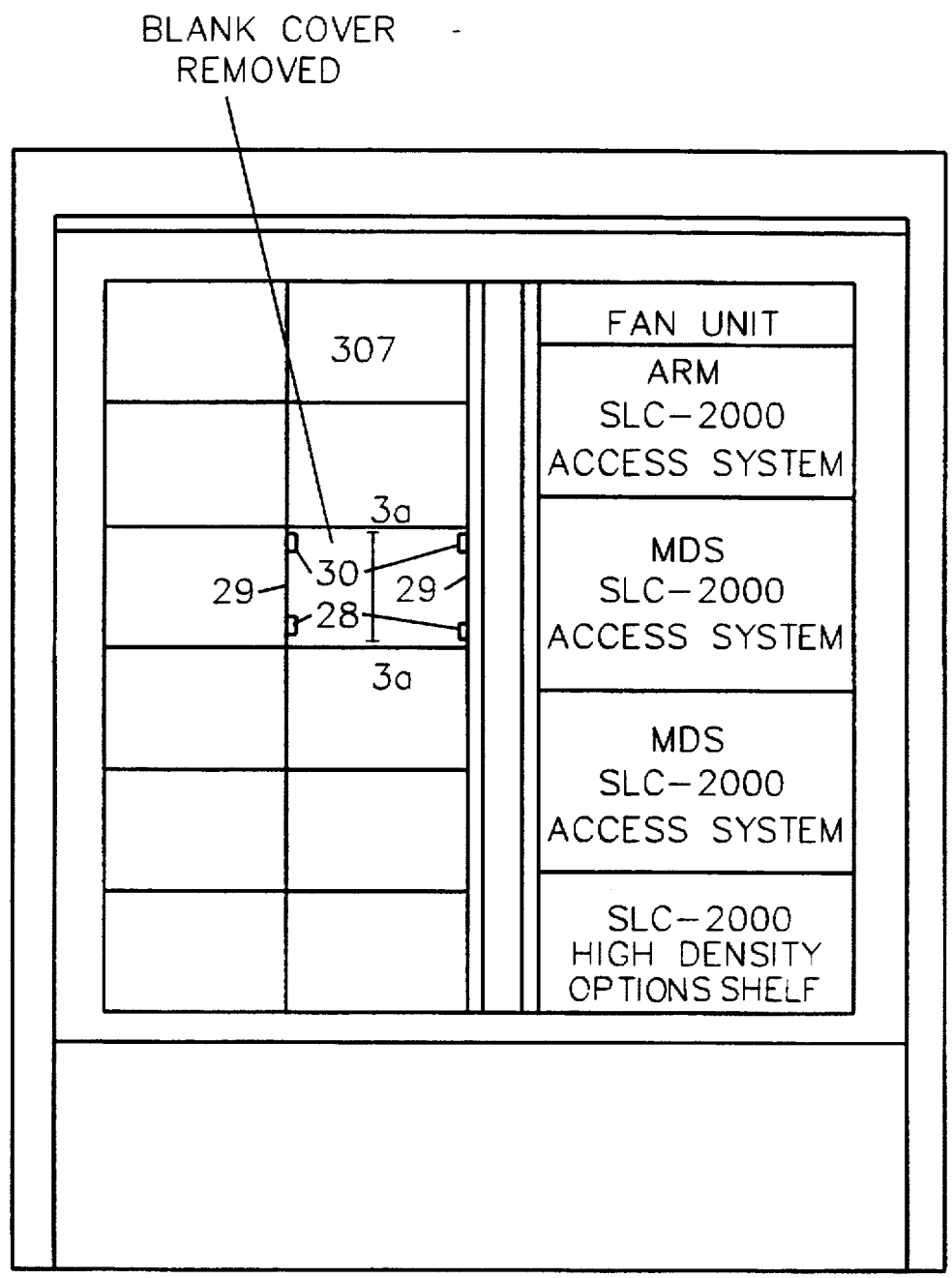
FIG. 3 is a front view of the typical remote cabinet with one of its blank panels removed in accordance with the invention.
Figure 3A:
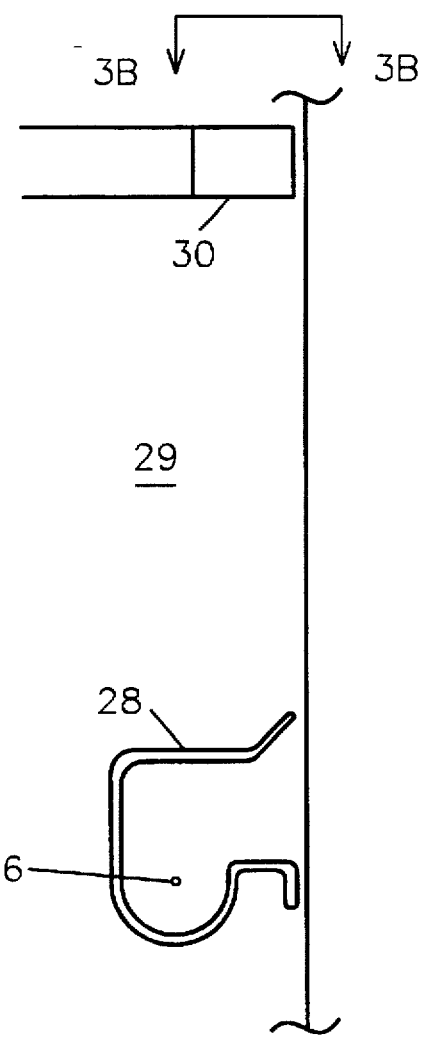
FIG. 3A is a view along lines 3A—3A of FIG. 3.
Figure 3B:
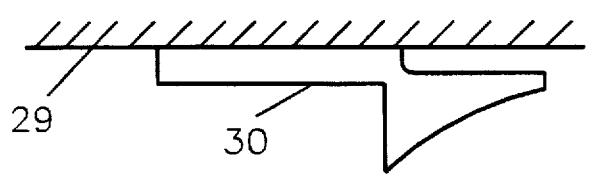
FIG. 3B is a view along lines 3B—3B of FIG. 3A.
Figure 4:
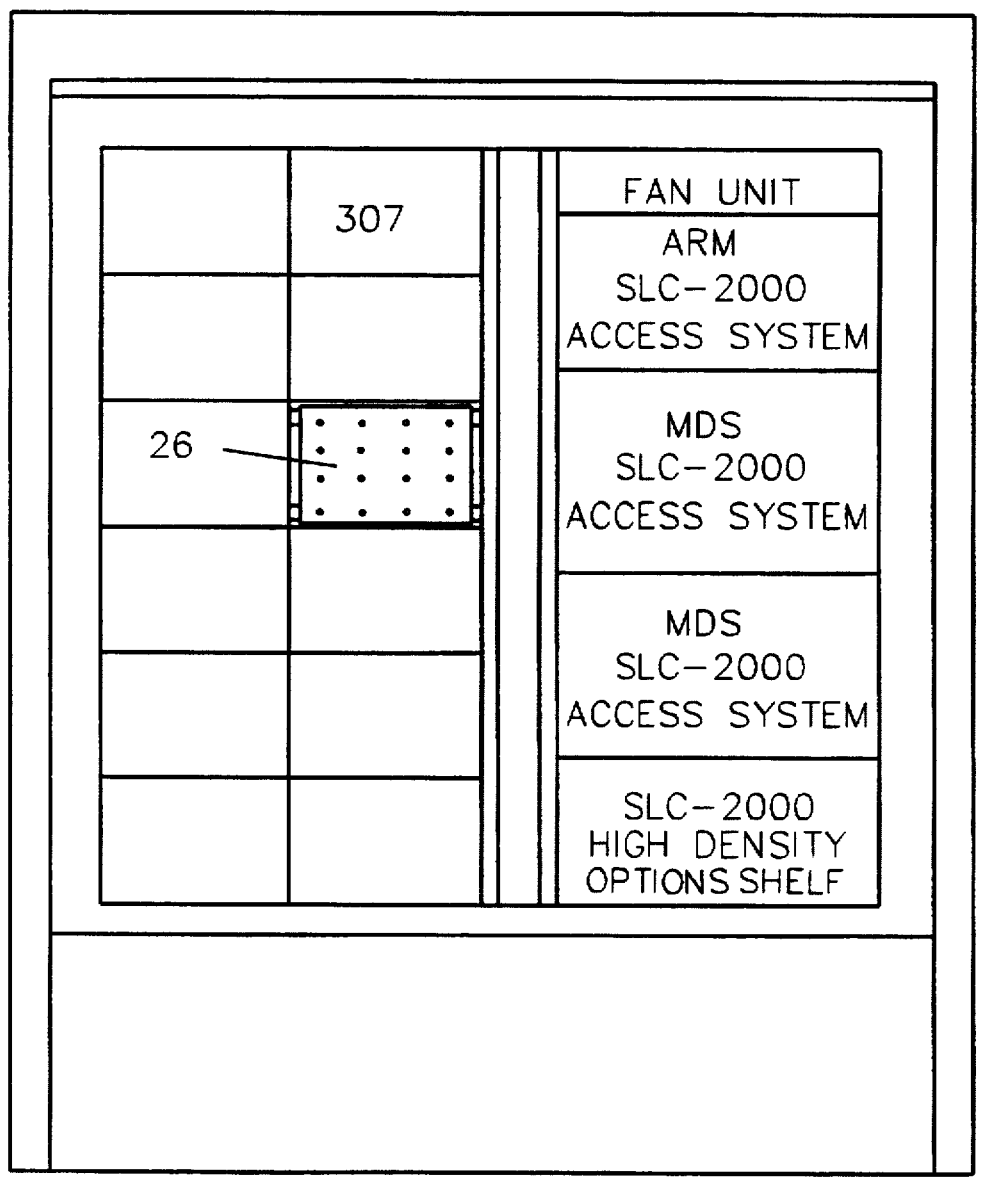
FIG. 4 is a front view of a typical remote cabinet with the T1/ISDN equipment, in accordance with the invention pivoted into its operating position.

Applicants have determined that the space not being used within the remote terminal can be advantageously employed using a unique arrangement of equipment to provide additional ISDN service to the customer premises without adversely affecting any of the other functions being performed at the remote terminal. Accordingly, a T1/ISDN unit 26 (referring to FIG. 4) is mounted in the cable entry portion of a remote cabinet in the space unoccupied by the protection block assembly. FIG. 3 illustrates a remote cabinet having one of the blank panels, covering the unused space, removed. These units, as described in more detail below, use existing hardware within the remote terminal cabinet 16 and mount using boss receiving receptacle 28 on sides 29 (referring to FIGS. 3 and 3A) within the remote terminal and snap into retainers 30 already in place within the remote terminal cabinet. FIGS. 3A and 3B illustrate this in greater detail. Accordingly, no additional mounting hardware is required. Electrical connectors to the T1/ISDN unit 26 are mounted at the rear or back of the unit and LED's or switches, as necessary, are mounted on the opposite or front face of the unit. A typical unit will have four dual ISDN cards, a common T1 input/power card, and two spare slots, all mounted on the unit chassis.

Figure 5:
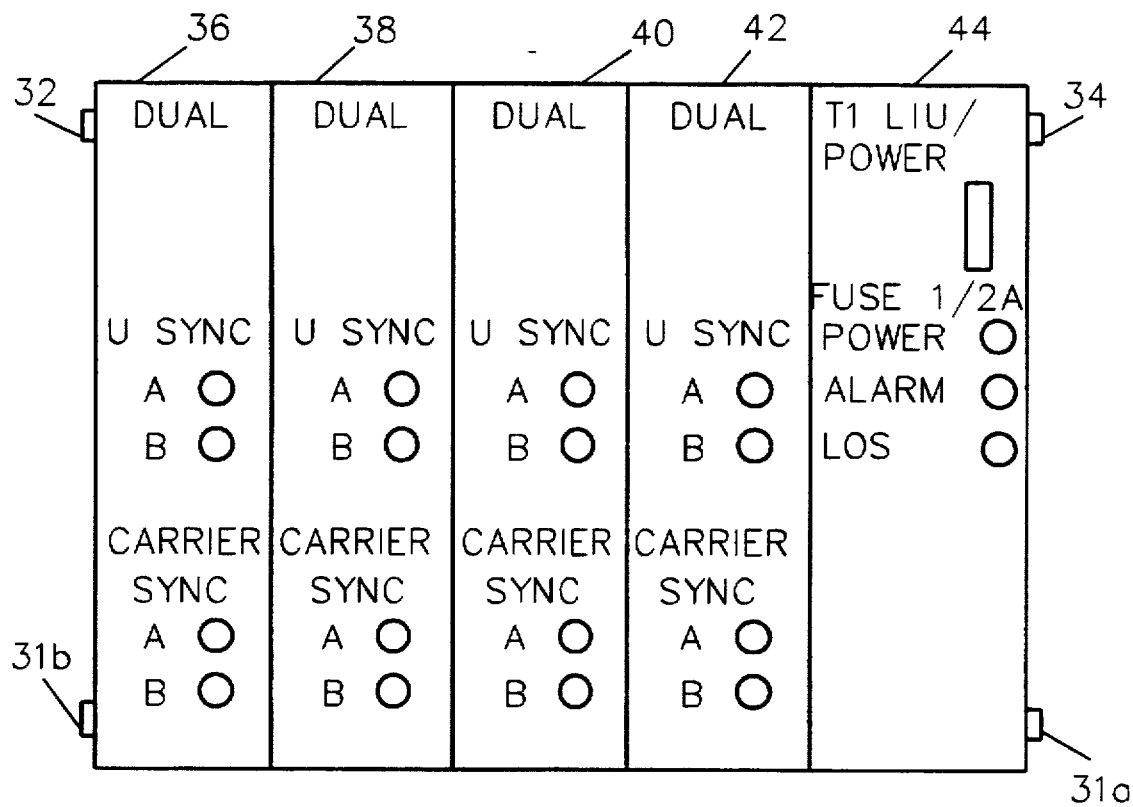
FIG. 5 is a front view of the interface modules used in accordance with the invention and showing its mounting hardware.
Figure 6:
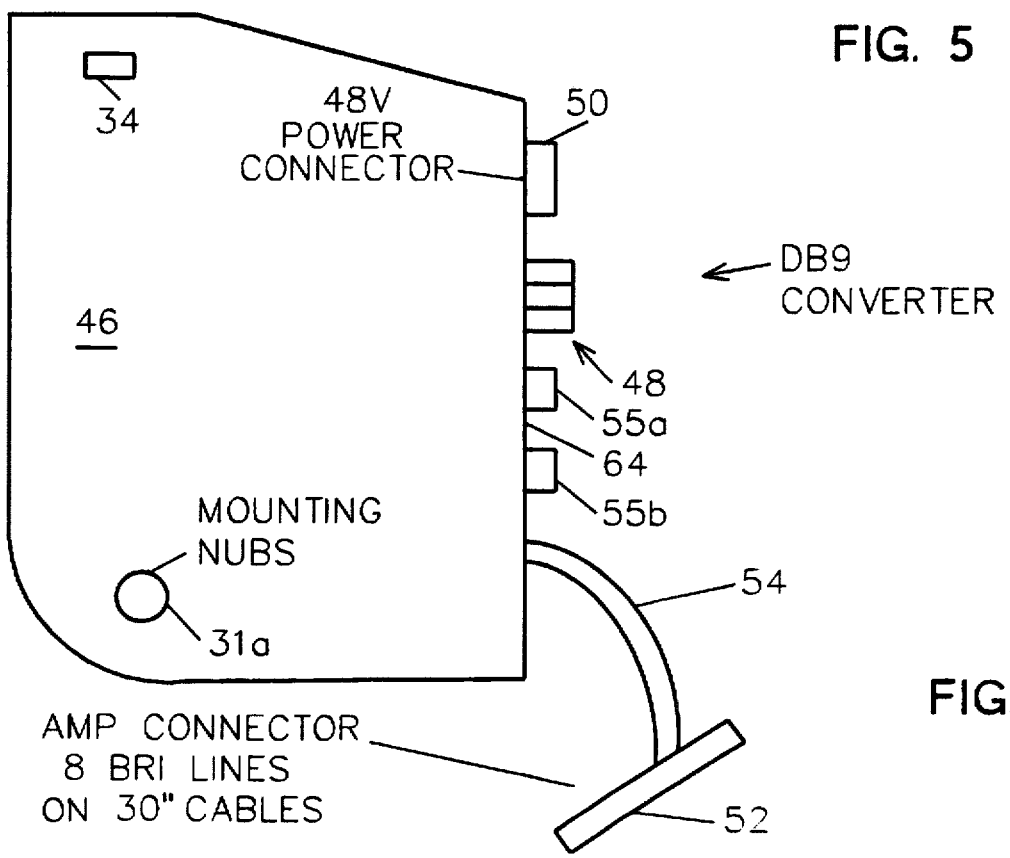
FIG. 6 is a side view of the equipment of FIG. 5.

Referring to FIG. 5 and 6, there is illustrated front and side views of a typical T1/ISDN multiplexer unit 26. As noted above, in viewing the unit from the front, the unit has two mounting nubs 31a, 31b, and two retainer units 32, 34, which are used in connection with hardware 28 and 30 already available in the remote cabinet. Each unit has four dual ISDN cards 36, 38, 40, and 42, and a T1/power unit 44 mounted in a chassis 46. Looking from the side of the unit, as indicated in FIG. 6, at the back of the unit there is a connection 48 available to connect to the T1 line(s), a power connector 50 for providing the power to the circuitry within the unit, and a cable connector 52 taking the eight ISDN lines 54 from the unit for connection to the customer premises interface. There are also connections 55a, 55b for alarm signals and mechanized loop testing.

Figure 7:
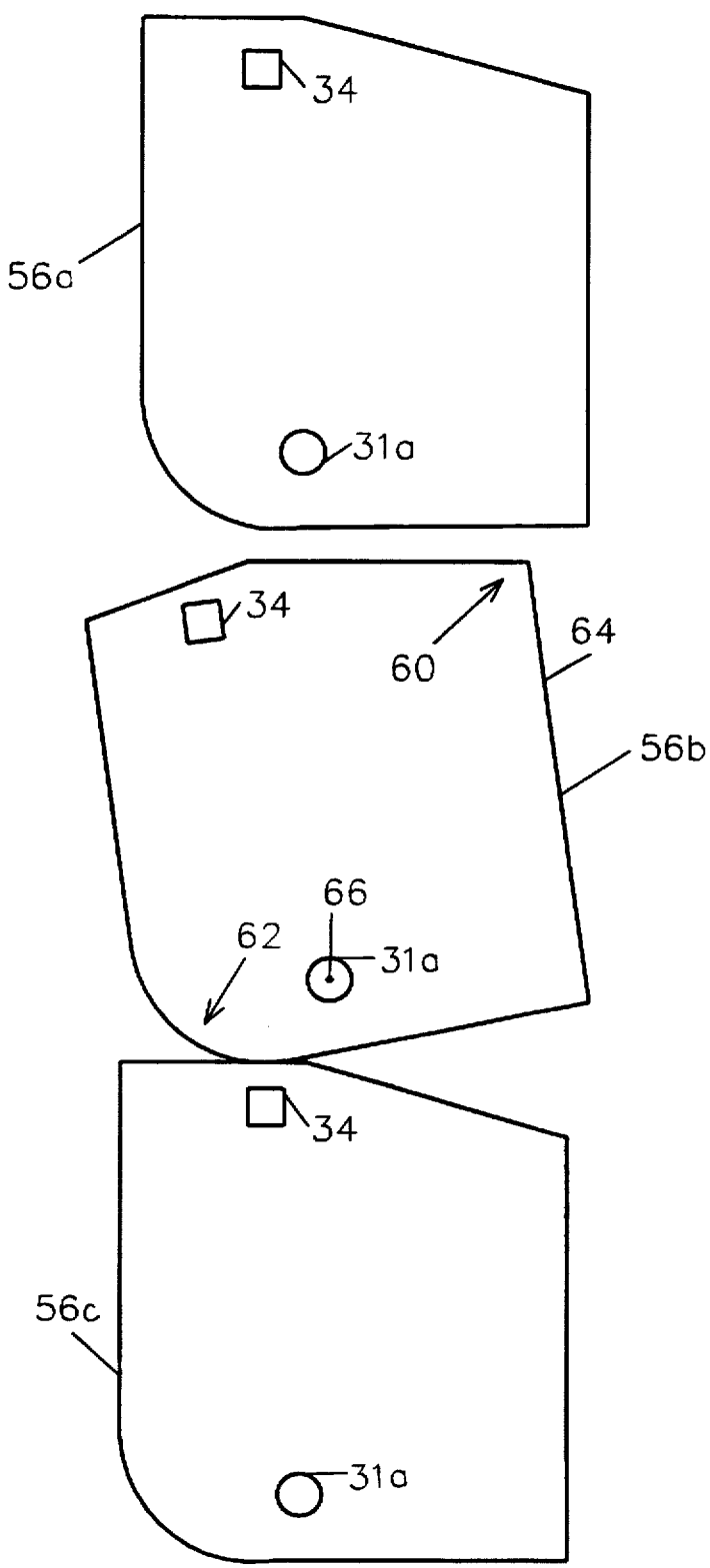
FIG. 7 is a side view of the equipment in accordance with a preferred embodiment of the invention illustrating the manner in which it pivots from a service position outside of the cabinet to an operating position within the cabinet.
Figure 8:
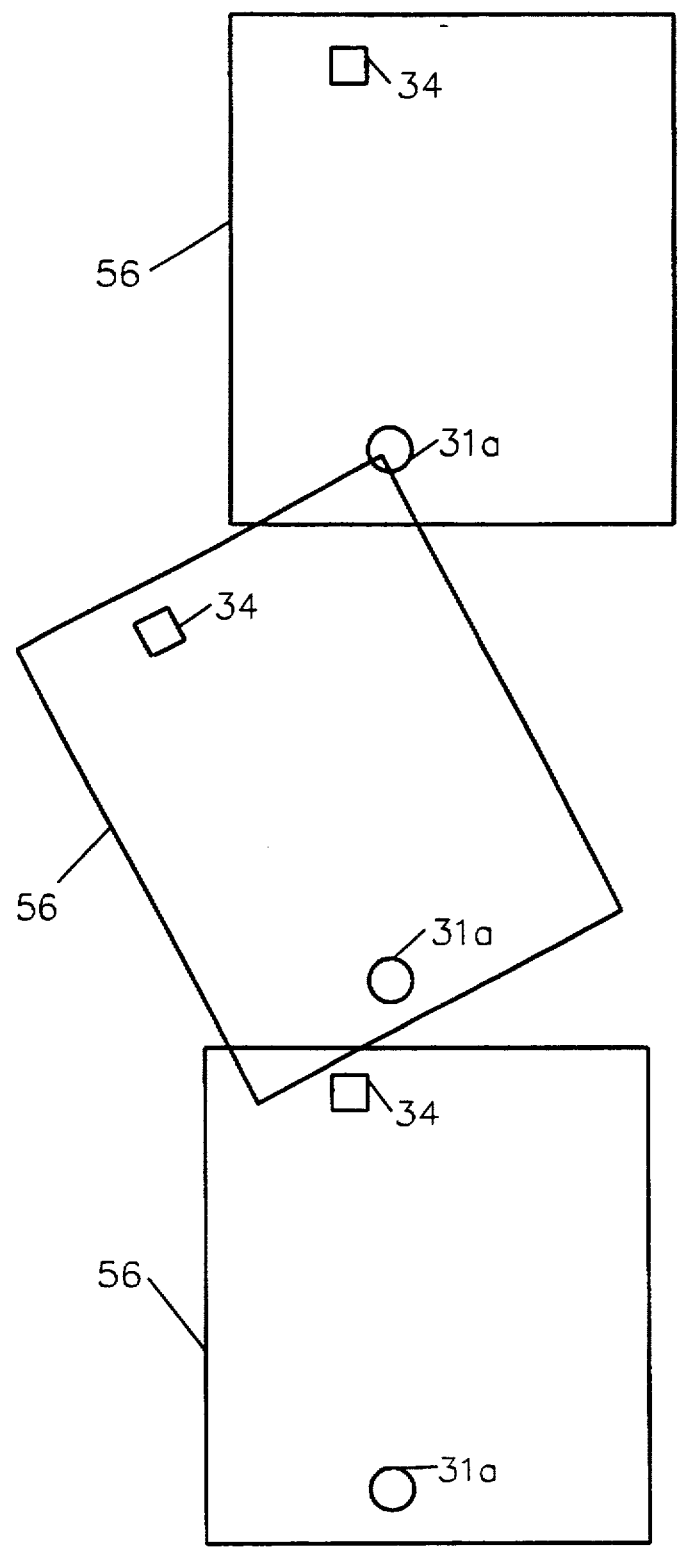
FIG. 8 is a side view of the equipment wherein there is interference in pivoting the chassis for removal or installation.

Referring now to FIG. 7, there is illustrated a vertical sequence of three units 26 mounted on chassis 56a, 56b, 56c, with the middle chassis 56b being pivoted out somewhat for either removal or installation. In order to allow the chassis 56b to rotate around bosses 28 on nubs 31a, 31b, without interference with either those chassis above (56a) or below (56c) it, in a preferred embodiment of the invention, at least two corners 60, 62 of the chassis are foreshortened on both sides of the chassis. In the preferred embodiment of the invention, corner 60 is foreshortened by angularly reducing its height, in particular at its back plane 64. At corner 62, the corner itself is rounded so that upon rotation about a pivot axis 66 at boss 28 and nub 31a, there is no interference between it and the next lower unit. FIG. 8 illustrates the comparable system wherein the corners are not foreshortened and in which substantial interference takes place between adjacent chassis so as to make it inoperative.

Figure 9:
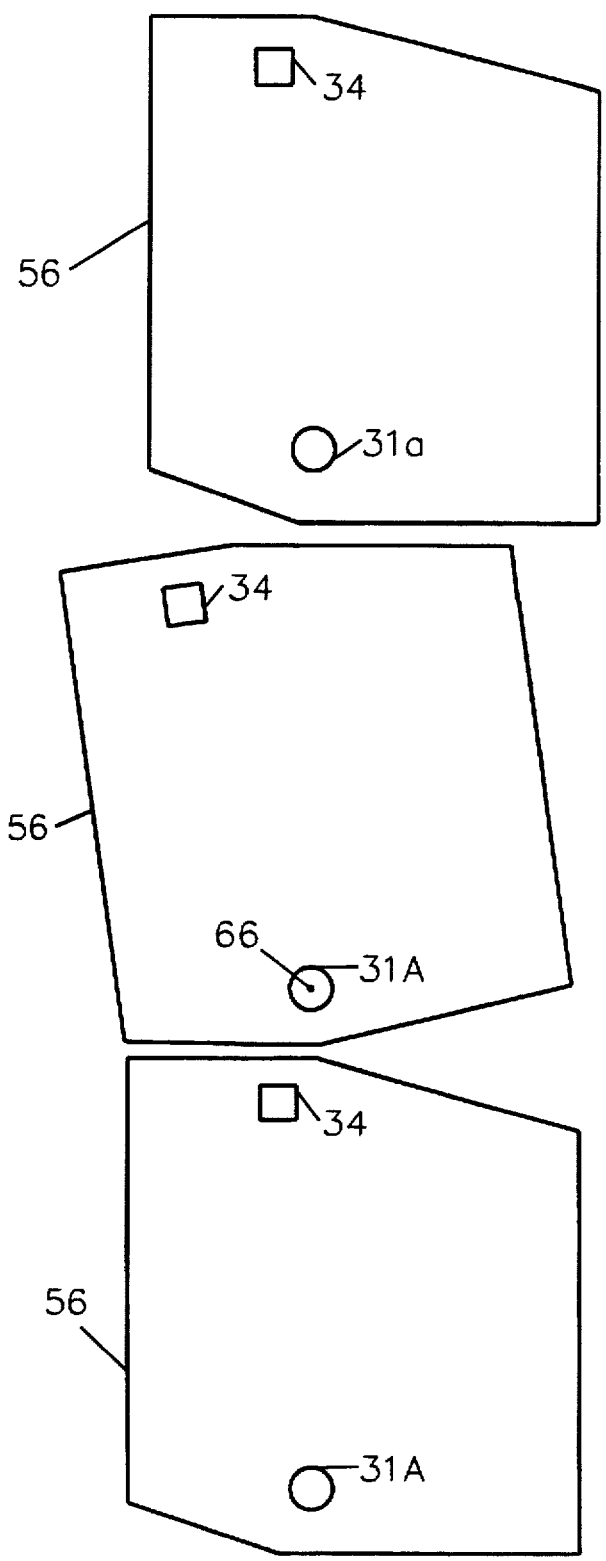
FIG. 9 is an alternate embodiment of the configuration of equipment for pivoting into and out of the protection block space in accordance with the invention.

Referring now to FIG. 9, the corner 62 can be foreshortened in other ways and still provide enough rotation about axis 66 to enable a chassis to be pivoted from its operating condition, wherein the retaining elements 31a, 31b snap into place, to its removal, installation, or service position as illustrated in the figures. Thus, different methods and structures can be used to foreshorten the units to enable them to pivot into and out of their operational position using the preexisting hardware in the remote cabinet.

Figures 10, 10A:
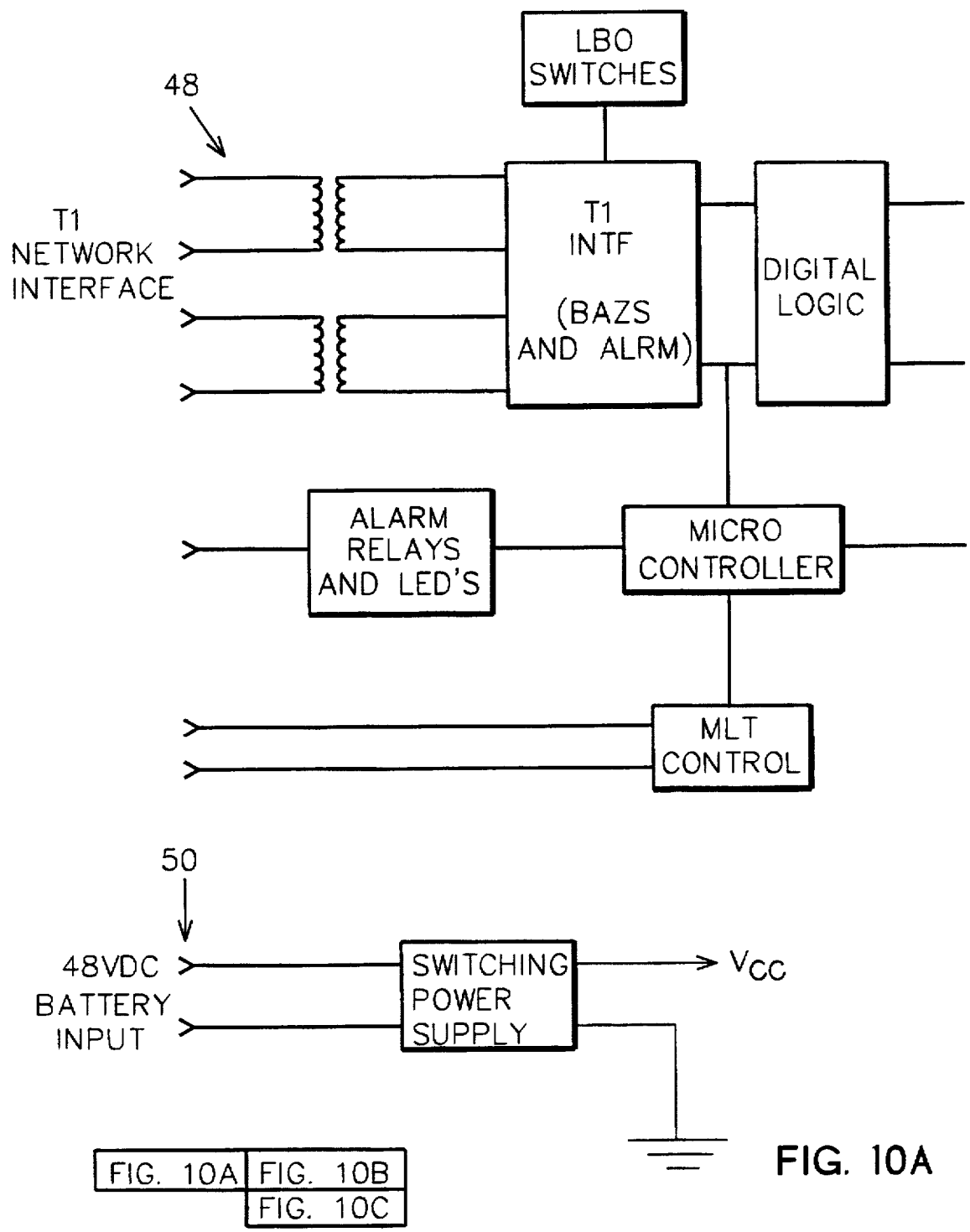
FIG. 10 is an electrical block diagram of the equipment providing the T1 to ISDN interfaces in accordance with a preferred embodiment of the invention.
Figure 10B:
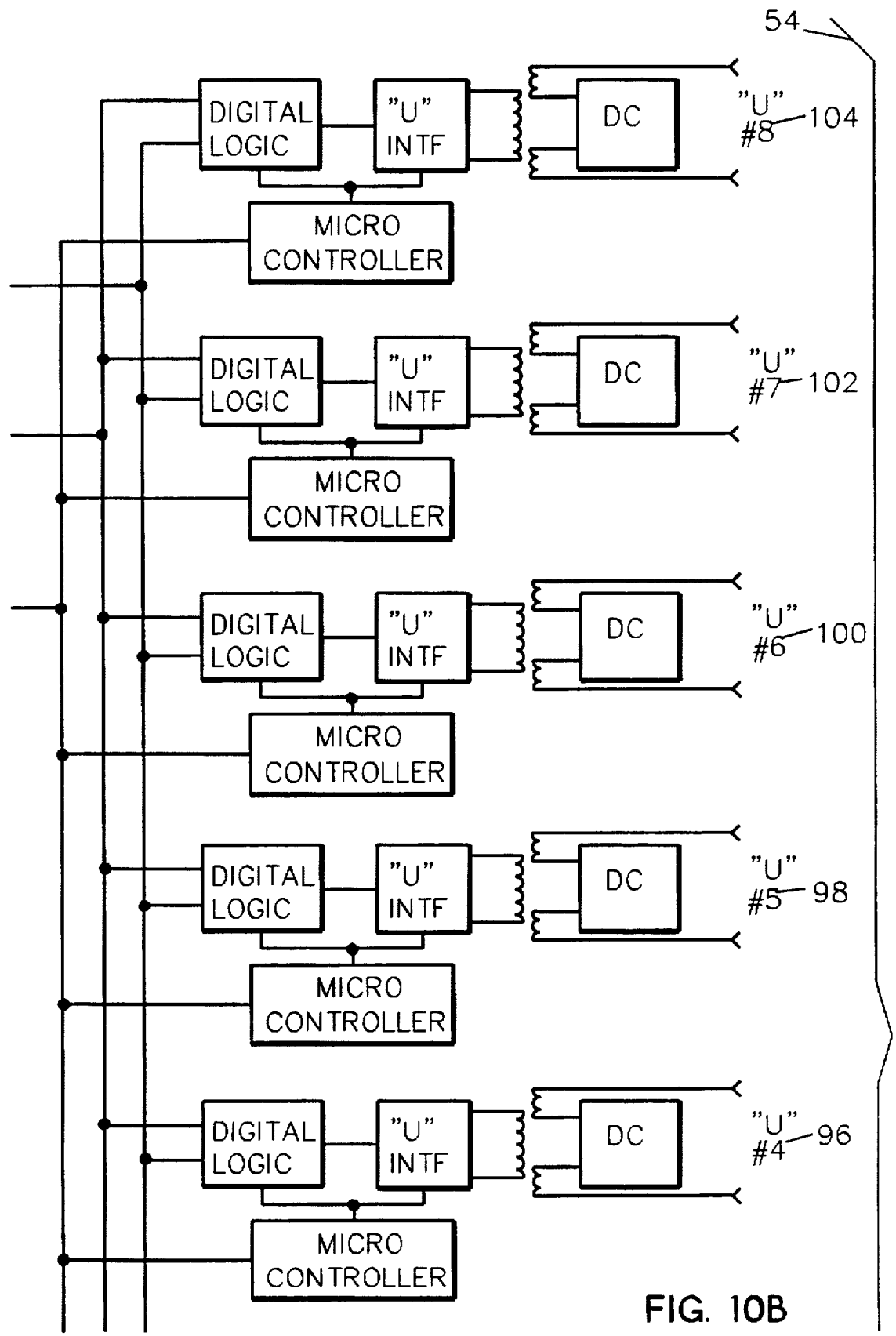
Figure 10C:
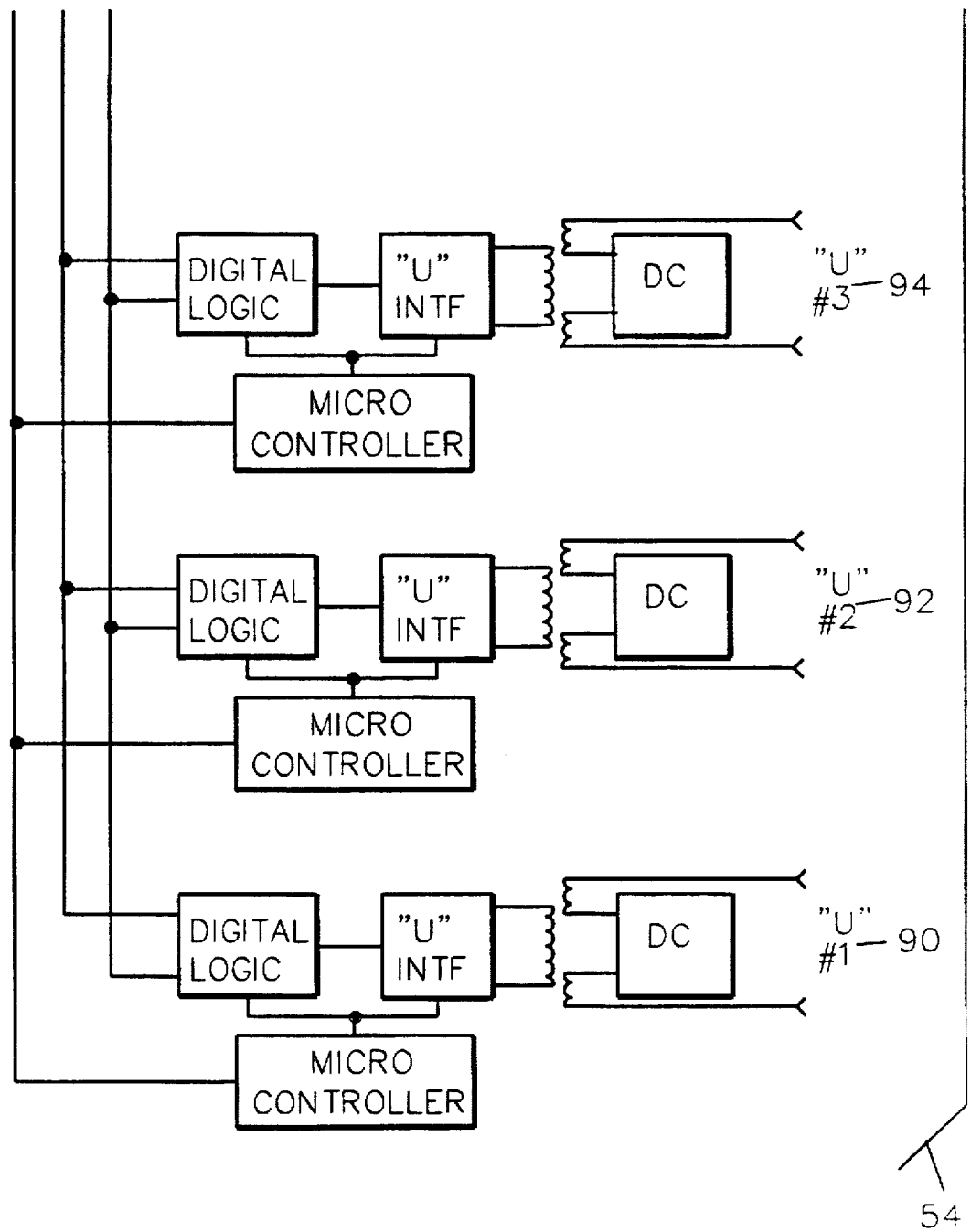

Referring now to FIG. 10, each unit electrically has a plurality of microprocessor controllers for receiving the T1 line operating at 1.544 megahertz and providing, at the outputs 90, 92, 94, 96, 98, 100, 102, and 104, the ISDN BRI services to the customer premises. This circuitry is well known in the art and is available from many vendors, including, for example, Conklin Instrument Corporation, the assignee of this application. Other inputs/outputs to the equipment include not only a battery power input 50 at minus 48 volts, but also the alarm signals, and the T1 interface and MLT control inputs.

Thus, in accordance with the invention, additional ISDN BRI capacity can be inserted into an already capacity limited and full remote cabinet. In operation, the blank panel which covers the space into which the additional circuitry will be put is snapped out, revealing the retaining elements and the bosses about which the nubs will pivot around axis 66. The new equipment in accordance with the invention is then placed on the bosses for pivotal rotation and the unit is pivoted around axis 66 from its initial installation/servicing position wherein it extends away from the plane of the protection volume or space to its operating position at which it snaps into place in the volume previously meant for the protection block. Prior to rotation to its operating position, all of the electrical connections for the T1, ISDN, alarms, MLT, and power lines are made.

As noted before, corners of the chassis are foreshortened in order to facilitate, and in fact allow, a noninterfering movement of the chassis to and from its operating position.

Additions, subtractions, and other modifications of the described preferred embodiments of the invention will be apparent to those of ordinary practice in this field and are within the scope of the following claims.

What is claimed is:

1. A method for increasing the capacity of a remote terminal cabinet for providing ISDN Basic Rate Interfaces comprising the steps of identifying, in said remote terminal cabinet, a space previously designated and lacking protection block equipment, installing in said space ISDN Basic Rate Interface equipment, including securing said equipment physically in place and connecting said equipment for communication with a T1 carrier service on first communications interface and a plurality of ISDN BRI interfaces to customers at a second communications interface, and leaving any other preexisting remote cabinet communications unaffected.

2. The method of claim 1 wherein said securing step further comprises the steps of pivotably mounting said ISDN BRI equipment for pivotable movement to and from a secured position in said space, and securing said equipment in said space when said equipment is pivoted into said space from a mounting position outside said space.

3. The method of claim 2 wherein said equipment provides at least eight ISDN BRI Interfaces from said T1 carrier service.

4. The method of claim 1 further comprising the step of removing a protective covering from said space prior to said installing step.

5. Apparatus for providing at least eight ISDN Basic Rate Interfaces in a remote cabinet comprising an interconnection equipment having
an interface to at least one T1 line,
at least eight ISDN Basic Rate Interfaces for connection to telephone subscribers, and
circuitry for interconnecting between said T1 line and said ISDN interfaces, a pivot mount for connecting said equipment for pivoting movement from a service position in which said equipment is available for servicing or installation in said remote cabinet to an operating position in which said equipment fits within a previously blank volume within a full capacity remote terminal, and a chassis for mounting said equipment, said chassis having said pivot mount and further having at least two corners of each side thereof foreshortened to allow said chassis, with said equipment, to pivot into said operating position.

6. The apparatus of claim 5 further comprising said interconnection equipment and said pivot mount having a solid substantially rectangular shape for pivoting into a protection block space in said remote terminal cabinet for a 307 protection block assembly.

7. The apparatus of claim 5 further comprising interface connectors for electrically interconnecting said T1 line to said T1 interface and for connecting said at least eight ISDN interfaces to customer ISDN lines.

* * * * *